United States Patent
Iwamoto

(10) Patent No.: US 7,552,028 B2
(45) Date of Patent: Jun. 23, 2009

(54) RECORDING MEDIUM, TEST APPARATUS AND DIAGNOSTIC METHOD

(75) Inventor: Satoshi Iwamoto, Tokyo (JP)

(73) Assignee: Advantest Corporation, Nerima-Ku, Tokyo (JP)

( * ) Notice: Subject to any disclaimer, the term of this patent is extended or adjusted under 35 U.S.C. 154(b) by 0 days.

(21) Appl. No.: 11/607,824

(22) Filed: Dec. 1, 2006

(65) Prior Publication Data

US 2008/0129313 A1 Jun. 5, 2008

(51) Int. Cl.
*G06F 11/30* (2006.01)
(52) U.S. Cl. .................. 702/183; 702/57; 702/117; 324/73.1
(58) Field of Classification Search .............. 702/57, 702/64, 65, 117–123, 182, 183, 185; 714/37, 714/36; 324/500, 527, 763, 764, 73.1
See application file for complete search history.

(56) References Cited

U.S. PATENT DOCUMENTS

| | | | | |
|---|---|---|---|---|
| 4,397,021 A | * | 8/1983 | Lloyd et al. | 714/33 |
| 5,059,893 A | * | 10/1991 | Hiral et al. | 324/74 |
| 6,134,674 A | * | 10/2000 | Akasheh | 714/33 |
| 7,000,056 B2 | * | 2/2006 | Poisner | 710/305 |
| 7,158,908 B2 | | 1/2007 | Iwamoto | |

(Continued)

FOREIGN PATENT DOCUMENTS

JP 2002-174663 6/2002

(Continued)

OTHER PUBLICATIONS

Patent Abstracts of Japan; Publication No.: 2002-174663, Publication Date: Jun. 21, 2002, 2 pages.

(Continued)

*Primary Examiner*—Manuel L Barbee
(74) *Attorney, Agent, or Firm*—Osha • Liang LLP

(57) ABSTRACT

A test apparatus that tests a device under test is provided. The test apparatus includes a test module that provides a test signal to the device under test. The test apparatus includes: a test module that provides a test signal to the device under test; a measuring instrument that measures a reference parameter including at least one of a reference voltage, a reference resistance and a reference current included in the test module; and a control device that controls the test module and the measuring instrument. By executing a diagnostic program that diagnose the plurality of test modules by using the measuring instruments, the control device to function as: a target diagnostic section that diagnoses a target test module; an acquirement section that acquires measuring instrument identification information indicative of the kind of the measuring instrument provided in the test apparatus; a measurement processing section provided for each kind of the measuring instruments and executed on the control device that issues a command to cause the measuring instrument to measure the value of the reference parameter of the test module to the measuring instrument and receives a measurement result of the reference parameter from the measuring instrument; and a switching section that calls the measurement processing section corresponding to the measuring instrument identified by the measuring instrument identification information in response to receiving the call to instruct to measure the value of a reference parameter included in the test module, executes the same and returns the measurement result of the reference parameter to the target diagnostic section.

7 Claims, 5 Drawing Sheets

U.S. PATENT DOCUMENTS

2004/0215361 A1* 10/2004 Hlotyak et al. ............. 700/121
2006/0224926 A1   10/2006 Iwamoto
2006/0259264 A1   11/2006 Iwamoto

FOREIGN PATENT DOCUMENTS

| JP | 2004-163194   | 6/2004  |
| JP | 2004163194 A  | 6/2004  |
| JP | 2006-275986   | 10/2006 |
| WO | 2006109463 A1 | 10/2006 |
| WO | 2006120852 A1 | 11/2006 |

OTHER PUBLICATIONS

Patent Abstracts of Japan, Publication No.: 2004-163194, Publication Date: Jun. 10, 2004, 2 pages.
Japanese PCT International Investigative Report for International Patent Application No. PCT/JP2007/071636, dated Feb. 5, 2008, and English translation thereof, 9 pages.

* cited by examiner

RECORDING MEDIUM, TEST APPARATUS AND DIAGNOSTIC METHOD

BACKGROUND

1. Field of the Invention

The present invention relates to a recording medium, a test apparatus and a diagnostic method. Particularly, the present invention relates to a recording medium on which a program for diagnosing test modules in the test apparatus is recorded, the test apparatus and a diagnostic method. The test apparatus includes a plurality of the test modules that provide test signals to device under tests and a control device that controls the plurality of test modules.

2. Related Art

A test apparatus that tests a DUT (Device Under Test) such as a memory, a logic LSI or a SoC (System on Chip) includes a test module that inputs/outputs a signal to/from the DUT. For example, the test apparatus determines pass/fail of the DUT by providing a test signal in response to a call which instructs to measure the value of a reference parameter of the DUT from the test module, receiving an output signal outputted from an output terminal of the DUT in response to the test signal and comparing the test signal with an expected value.

The test apparatus has a diagnostic function in order to determine pass/fail. The test apparatus also diagnoses whether each test module is abnormal in the process of the diagnosis. In diagnosing the test module, the test apparatus determines whether the measurement result is within a normal value by measuring by a measuring instrument a reference voltage, a reference current and a reference resistance of the target test module, for example. Additionally, in diagnosing the test module, the control device of the test apparatus executes a program to transmit a command through a bus such as a GP-IB to control the measuring instrument.

Meanwhile, when the kind of the measuring instrument provided in the test apparatus is changed, the command transmitted from the control device to the measuring instrument is changed, so that it has been necessary to modify the program corresponding to the change of the command. Additionally, when the kind of the measuring instrument provided in the test apparatus is changed, the bus which connects between the measuring instrument and the control device also could be changed. In this case, it has been necessary to modify the program, too. Accordingly, the designer of the test module should have modified the program to diagnose the test module every time the kind of the measuring instrument provided in the test apparatus is changed.

Thus, the advantage of the present invention is to provide a recording medium, a test apparatus and a diagnostic method which are capable of solving the problem accompanying the conventional art. The above and other advantages can be achieved by combining the features recited in independent claims. Then, dependent claims define further effective specific example of the present invention.

SUMMARY

In order to solve the above described problems, a first aspect of the present invention provides, in a test apparatus including test modules that provide test signals to device under tests, a measuring instrument that measures a reference parameter including at least one of a reference voltage, a reference resistance and a reference current of the test module and a control device that controls the test modules and the measuring instrument, a recording medium on which a diagnostic program that causes the control device to diagnose the plurality of test modules by using the measuring instrument is recorded. The diagnostic program includes: a target diagnostic software module that causes the control device to diagnose a target test module; an acquirement module that causes the control device to acquire measuring instrument identification information indicative of the kind of the measuring instrument provided in the test apparatus; a measurement software module provided for each kind of the measuring instruments and executed on the control device that causes the control device to issue a command to cause the measuring instrument to measure the value of the reference parameter of the test module to the measuring instrument and receives the measurement result of the reference parameter from the measuring instrument; and a switching software module that calls the measurement software module corresponding to the measuring instrument identified by the measuring instrument identification information, causes the control device to execute the same and returns the measurement result of the reference parameter to the target diagnostic software module.

A second aspect of the present invention provides, in a test apparatus including test modules that provide test signals to device under tests, a measuring instrument that measures a reference parameter including at least one of a reference voltage, a reference resistance and a reference current of the test module and a control device that controls the test modules and the measuring instrument, a recording medium on which a diagnostic program called from a target diagnostic software module that causes the control device to diagnose a target test module so as to cause the control device to control the measuring instrument is recorded. The diagnostic interface program includes: an acquirement module that causes the control device to acquire measuring instrument identification information indicative of the kind of the measuring instrument provided in the test apparatus; a measurement software module provided for each kind of the measuring instruments and executed on the control device that causes the control device to issue a command to cause the measuring instrument to measure the value of the reference parameter of the test module to the measuring instrument and receives the measurement result of the reference parameter from the measuring instrument; and a switching software module that calls the measurement software module corresponding to the measuring instrument identified by the measuring instrument identification information in response to receiving the call to instruct to measure the value of a reference parameter included in the test module, causes the control device to execute the same and returns the measurement result of the reference parameter to the target diagnostic software module.

A third aspect of the present invention provides a test apparatus that tests a device under test. The test apparatus includes: a test module that provides a test signal to the device under test; a measuring instrument that measures a reference parameter including at least one of a reference voltage, a reference resistance and a reference current included in the test module; and a control device that controls the test module and the measuring instrument. By executing a diagnostic program that diagnose the plurality of test modules by using the measuring instruments, the control device to function as: a target diagnostic section that diagnoses a target test module; an acquirement section that acquires measuring instrument identification information indicative of the kind of the measuring instrument provided in the test apparatus; a measurement processing section provided for each kind of the measuring instruments and executed on the control device that issues a command to cause the measuring instrument to measure the value of the reference parameter of the test module to the measuring instrument and receives a measurement result of the reference parameter from the measuring instrument; and a switching section that calls the measurement processing section corresponding to the measuring instrument identified by the measuring instrument identification information in response to receiving the call to instruct to measure the value of a reference parameter included in the test module, executes the same and returns the measurement result of the reference parameter to the target diagnostic section.

A forth aspect of the present invention provides, in a test apparatus including test modules that provide test signals to device under tests, a measuring instrument that measure a reference parameter including at least one of a reference voltage, a reference resistance and a reference current of the test module and a control device that controls the test module and the measuring instrument, a diagnostic method of causing the control device to diagnose the plurality of test modules by using the measuring instrument. The diagnostic method includes the steps of: causing a target diagnostic software module that diagnose a target test module to execute on the control device; causing the control device to acquire measuring instrument identification information indicative of the kind of the measuring instrument provided in the test apparatus; causing a measurement software module provided for each kind of the measuring instruments and executed on the control device that causes the control device to issue a command to cause the measuring instrument to measure the value of a parameter of the test module and receives the measurement result of the reference parameter from the measuring instrument to execute on the control device; calling the measurement software module corresponding to the measuring instrument identified by the measuring instrument identification information in response to receiving the call to instruct to measure the value of the reference parameter included in the test module, causing the control device to execute the same and returning the measurement result of the reference parameter to the target diagnostic software module.

Here, all necessary features of the present invention are not listed in the summary of the invention. The sub-combinations of the features may become the invention.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
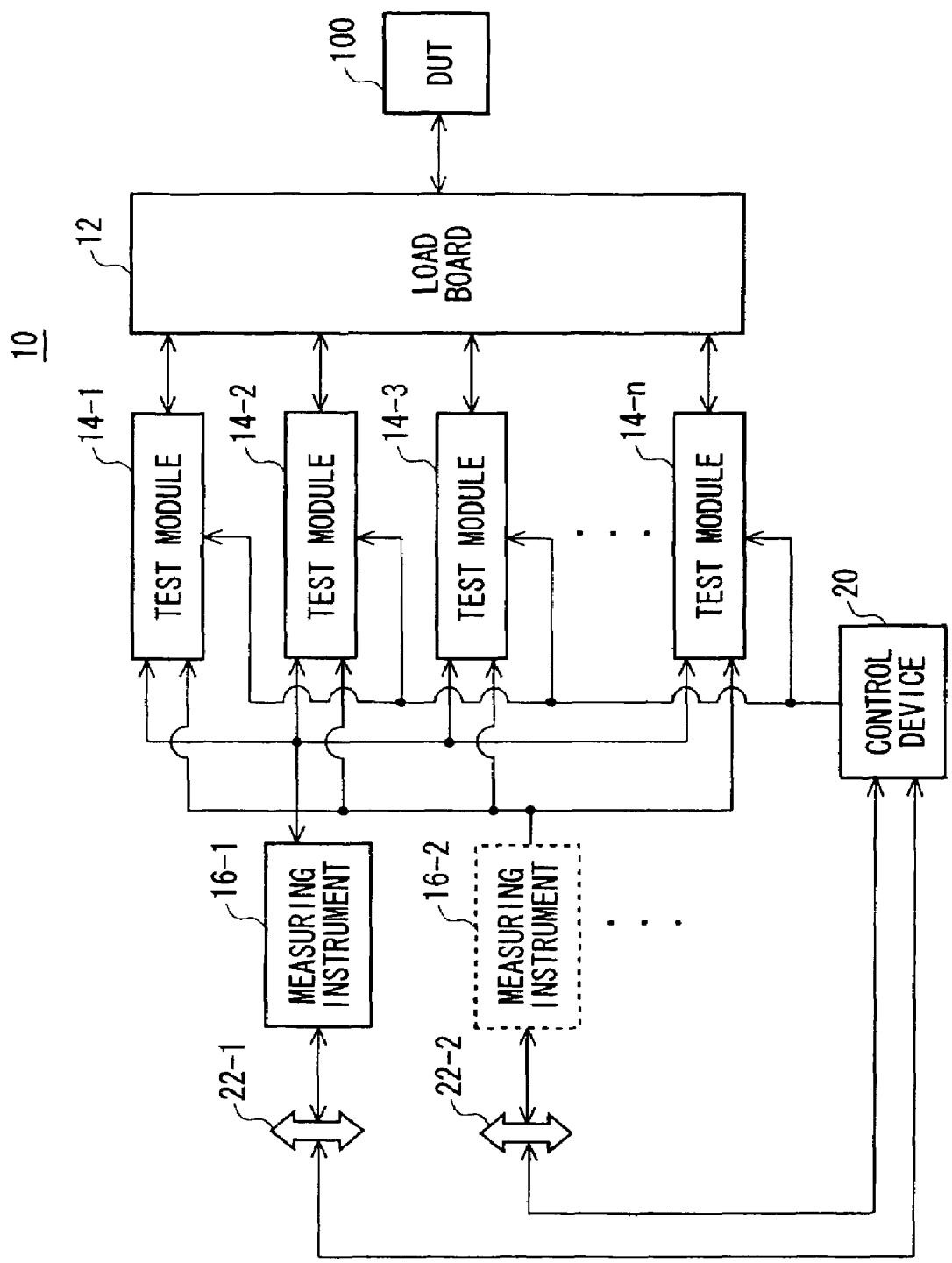
FIG. 1 shows a configuration of a test apparatus 10 according to an embodiment of the present invention with a DUT 100.

FIG. 1 shows a configuration of a test apparatus 10 according to an embodiment of the present invention with a DUT (Device Under Test) 100. The test apparatus 10 tests the DUT 100. More specifically, the test apparatus 10 generates a test signal, provides the same to the DUT 100 and determines pass/fail of the DUT 100 based on whether an output signal outputted from the DUT 100 as the result that the DUT 100 operates based on the test signal is matched with an expected value.

The test apparatus 10 includes a load board 12, at least one of test modules 104, measuring instruments 16 and a control device 20. The load board 12 includes a DUT 100 thereon and connects between the test module 14 and the DUT 100. Here, on diagnosing, the test apparatus 10 may include the load board 12 for diagnosing which does not include the DUT 100 thereon instead of the load board 12 for testing.

Each test module 14 (14-1-14-n, where n is any positive integer) is connected to a terminal included in the DUT 100 and tests the DUT 100 based on a test program and test data provided from the control device 20. In testing the DUT 100, each test module 14 generates a test signal from the test data based on a sequence defined by the test program and provides the test signal to the terminal of the DUT 100 connected to the test module 14. Additionally, the test module 14 acquires the output signal outputted by the DUT 100 as the result that the DUT 100 operates based on the test signal and compares the output signal with an expected value. Then, the test module 14 transmits the result obtained by comparing the output signal with the expected value to the control device 20 as a test result.

Further, the test module 14 may include a reference voltage source, a reference resistance and a reference current source, for example. Testing the DUT 100, the test module 14 generates a test signal by using the reference voltage source, the reference resistance and the reference current source and acquires the output signal.

The measuring instrument 16 measures a reference parameter including at least one of the reference voltage, the reference resistance and the reference current. The measuring instrument 16 receives from a command from the control device 20 and measures according to the received command. Then, the measuring instrument 16 returns the measurement result to the control device 20.

At diagnosing, the measuring instrument 16 is connected to such as a voltage source, a resistor and a current source included in a target test module 14 by a switching control of the control device 20. Then, the measuring instrument 16 measures as the reference parameter at least one of the value of the reference voltage generated by the voltage source included in the test module 14 to which the measuring instrument is connected, the value of the reference resistance included in the test module 14 and the value of the reference current generated by the reference current source included in the test module 14 according to the command provided from the control device 20.

The control device controls each of the test modules 14 and the measuring instruments 16. In testing, the control device 20 controls the test modules 14. For example, the control device 20 stores a test program and test data used to test the DUT 100 in the test module 14 used to test the DUT 100. Next, the control device 20 instructs the test module 14 used to test the DUT 100 to start a test based on the test program and the test data in order to perform the test. Then, the control device 20 receives an interrupt indicating that the test is completed from the test module 14 and causes the test module 14 to perform a subsequent test based on the test result. p Additionally, in diagnosing the test module 14, the control device 20 controls the measuring instruments 16. The test apparatus 20 controls the measuring instruments 16 by executing a diagnostic program provided from such as a recording medium. In diagnosing each test module 14, the control device 20 performs a switching control to connect a target test module and the measuring instrument 16. Next, the control device 20 issues a command to the measuring instrument 16 to cause the measuring instrument 16 to measure the reference parameter, i.e. a parameter including at least one of the reference voltage, the reference resistance and the reference current included in the target test module 14. Then, the control device 20 receives the measurement result of the reference parameter and corrects the same to a value of the reference parameter which should be essentially outputted. Additionally, the control device 20 may receive the measurement result by the measuring instrument 16 and determine whether the target test module 14 normally operates based on the measurement result.

As described above, the test apparatus 10 can test the DUT 100. Additionally, the test apparatus 10 can correct each test module 14 such that the test module 14 normally operates.

Here, in the test apparatus 10, a first kind measuring instrument 16 (16-1) included therein can be replaced with a second kind measuring instrument 16 (16-2) of which class of command provided from the control device 20 is different from that of the first kind measuring instrument 16 (16-1) because such as the maker and the product version are different from that of the first kind of the measuring instrument 16 (16-1). Even if the provided measuring instrument is replaced with the other measuring instrument 16, the test apparatus 10 can diagnose each test module 14 without changing the description of the diagnostic program executed by the control device 20.

Additionally, the test apparatus 10 may further include a plural kinds of buses 22 (22-1, 22-2, . . . ) that connect between the control device 20 and the measuring devices 16. For example, the bus 22 may be a GP-IB (General Purpose-Interface Bus) and a USB (Universal Serial Bus). Here, when the measuring instrument 16 provided in the test apparatus 10 is replaced with the other measuring instrument 16, the measuring instrument 16 which has been replaced may be connected to the second kind bus 22 (22-2) different from the first kind bus 22 (22-1) to which the measuring instrument 16 before being replaced is connected. Thus, even if the kind of the bus 22 connected to the measuring instrument 16 is changed, the test apparatus 10 can diagnose each test module 14 without changing the description of the diagnostic program executed by the control device 20.

Figure 2:
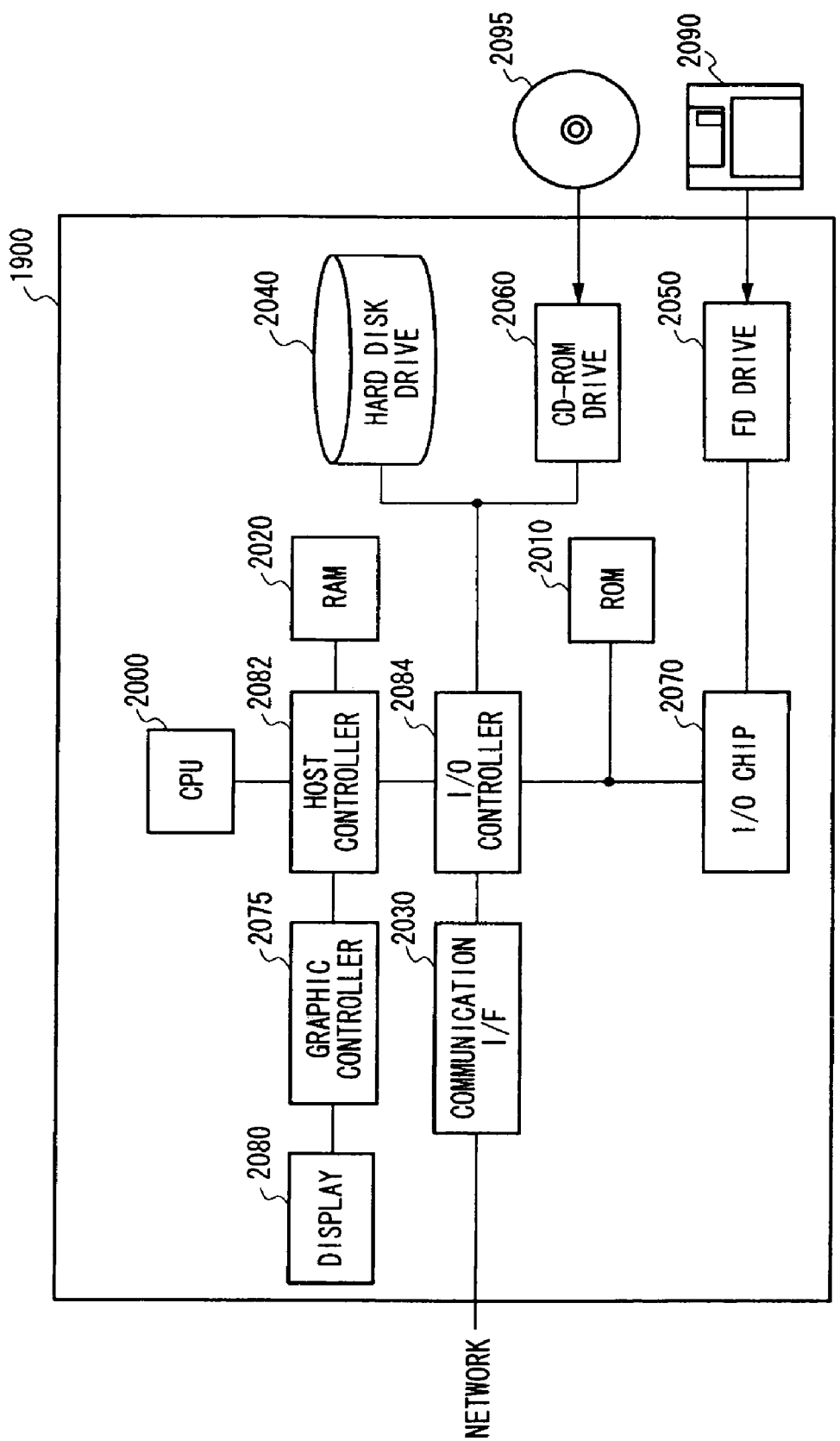
FIG. 2 shows an example of hardware configuration of a control device 20 according to an embodiment of the present invention.

FIG. 2 shows an example of hardware configuration of a control device 20 according to the present embodiment. A computer 1900 operates as the control device 20 includes a CPU periphery having a CPU 2000, a RAM 2020, a graphic controller 2075 and a display 2080 which are connected through a host controller 2082 each other, an input/output unit having a communication interface 2030, a hard disk drive 2040 and a CD-ROM drive 2060 which are connected to the host controller 2082 through an input/output controller 2084 and a legacy input/output unit having a ROM 2010, a flexible disk drive 2050 and an input/output chip 2070 which are connected to the input/output controller 2084.

The host controller 2082 connects the RAM 2020 to the CPU 2000 and the graphic controller 2075 which access the RAM 2020 with a high transfer ratio. The CPU 2000 operates according to the programs stored in the ROM 2010 and the RAM 2020 to control each unit. The graphic controller 2075 obtains image data generated on a frame buffer provided in the RAM 2020 by the CPU 2000 and displays the same on the display 2080. Alternatively, the graphic controller 2075 may include therein a frame buffer for storing image data generated by the CPU 2000.

The input/output controller 2084 connects the host controller 2082 to the communication interface 2030, the hard disk drive 2040 and the CD-ROM drive 2060 which are relatively high-speed input/output units. The communication interface 2030 communicates with the other device through a network. The hard disk drive 2040 stores the program and data used by the CPU 2000 in the computer 1900. The CD-ROM drive 2060 reads the program or data from the CD-ROM 2095 and provides the same to the hard disk drive 2040 through the RAM 2020.

The ROM 2010, and the flexible disk drive 2050 and input/output chip 2070 which are relatively low-speed input/output units are connected to the input/output controller 2084. The ROM 2010 stores a boot program executed by the CPU 2000 at activating the computer 1900 and a program depending on the hardware of the computer 1900. The flexible disk drive 2050 reads the programs or data from a flexible disk 2090 and provides the same to the hard disk drive 2040 through the RAM 2020. The input/output chip 2070 connects various input/output units through the flexible disk drive 2050 and such as a parallel port, a serial port, a keyboard port and a mouse port.

The program provided to the hard disk drive 2040 through the RAM 2020 is stored in a recording medium, such as the flexible disk 2090, the CD-ROM 2095, or an IC card and provided by the user. The program is read from the recording medium, installed into the hard disk drive 2040 in the computer 1900 through the RAM 2020 and executed by the CPU 2000.

The above-described programs or modules may be stored in an external storage medium. The recording medium may be, in addition to the flexible disk 2090 and the CD-ROM 2095, an optical storage medium such as a DVD and a CD, a magneto-optical recording medium such as a MO, a tape medium and a semiconductor memory such as an IC card. Additionally, a storage medium such as a hard disk or a RAM which is provided in the server system connected to a private communication network or Internet is used as the recording medium to provide the program to the computer 1900 through the network.

Figure 3:
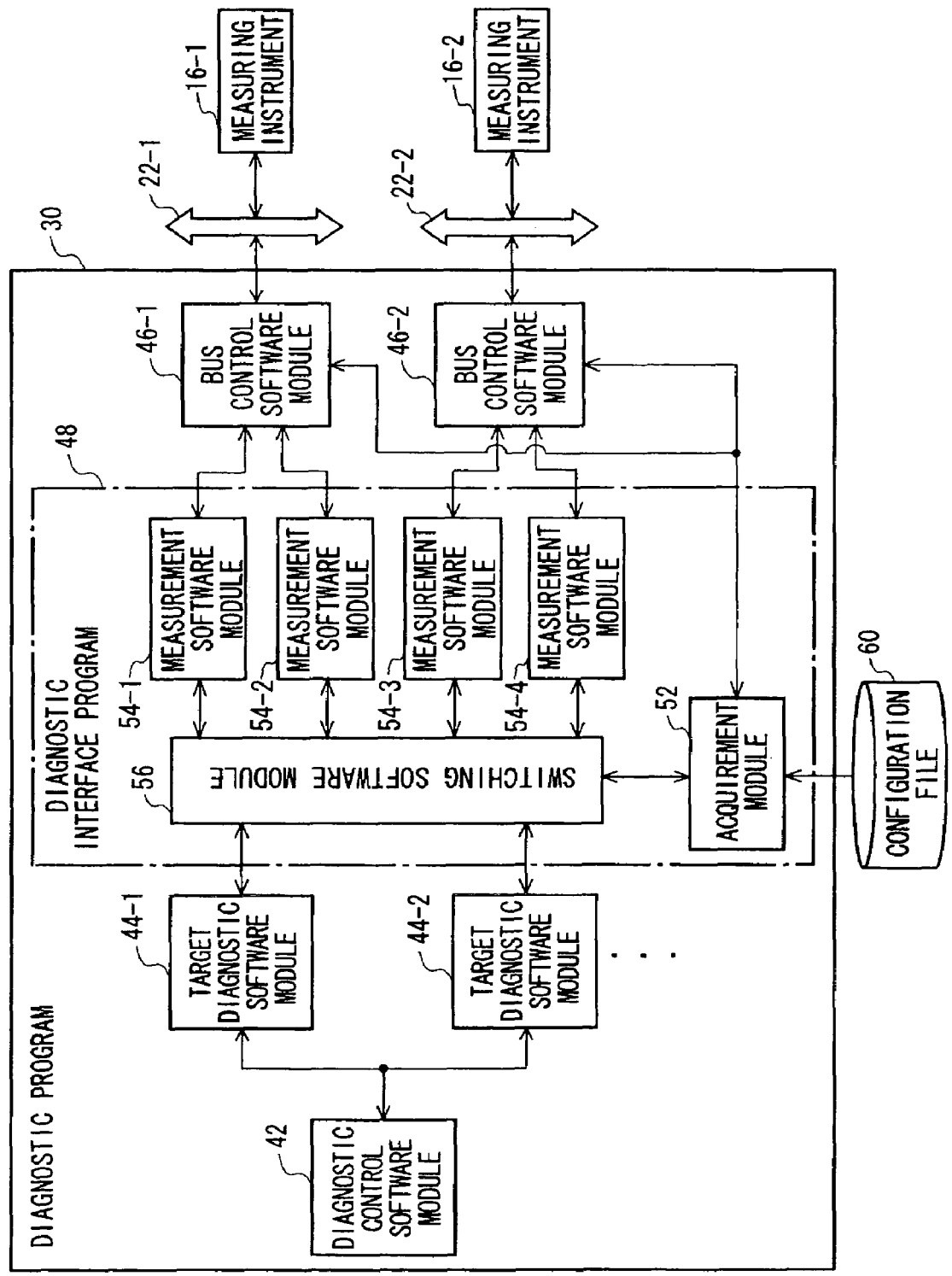
FIG. 3 shows a configuration of a diagnostic program 30 operating on the control device 20 according to an embodiment of the present invention with measuring instruments 16 and buses 22.

FIG. 3 shows a configuration of a diagnostic program 30 operating on the control device 20 according to the present embodiment with the measuring instruments 16 and the buses 22. The diagnostic program 30 causes the measuring instruments 16 to diagnose a plurality of test modules 14 provided in the test apparatus 10. The diagnostic program 30 is executed by the control device 20 while the test apparatus 10 includes such as a load board 12 for diagnosing therein to cause the control device 20 to control the measuring instruments 16, and diagnoses the target test module 14 which is provided in the test apparatus 10.

The diagnostic program 10 includes a diagnostic control software module 42, at least one of target diagnostic software modules 44, a diagnostic interface program 48 and at least one of bus control software modules 46. Those software modules are executed by the CPU 2000 of the control device 20.

Specifically, the diagnostic control software module 42 is executed by the CPU 2000 to cause the control device 20 to function as a diagnostic control section. Each target diagnostic software module 44 is executed by the CPU 2000 to cause the control device 20 to function as a target diagnostic section. The bus control software module 46 is executed by the CPU 2000 to cause the control device 20 to function as a bus control section. The diagnostic interface program 48 is executed by the CPU 2000 to cause the control device 20 to function as a diagnostic interface section.

The diagnostic control software module 42 is executed by the control device 20 to control the test apparatus 10 to diagnose the test modules 14. For example, the diagnostic control software module 42 selects a target test module 14, calls one of the target diagnostic software modules 44 corresponding to the target test module 14 and causes the control device 20 to execute the same.

Each target diagnostic software module 44 (44-1, 44-2, . . . ) is executed by the control device 20 and causes the control device 20 to diagnose the value of the reference parameter of the target test module 14. Those target diagnostic software modules 44 are described by the designer of the test module 14 for each kind of the test modules 14.

In diagnosing, the target diagnostic software module 44 causes the measuring instrument 16 to measure the reference parameter of the test module 14 to be diagnosed. Causing the measuring instrument 16 to measure the reference parameter, the target diagnostic software module 44 calls the diagnostic interface program 48 and instructs the measuring instrument 16 to measure the value of the reference parameter of the test module 14 through the called diagnostic interface program 48. Then, the target diagnostic software module 44 acquires the measurement result from the measuring instrument 16 through the called diagnostic interface program 48.

Each bus control software module 46 (46-1, 46-2, . . . ) is executed by the control device 20. Each of the bus control software modules 46 is provided for each kind of the buses 22 which connect between the control device 20 and the measuring instruments 16 and causes the control device 20 to communicate with the measuring instrument 16 through the bus 22.

The diagnostic interface program 48 is executed by the control device 20 in response to a call to instruct to measure the value of the reference parameter of the test module 14. Receiving the call from the target diagnostic software module 44, the diagnostic interface program 48 transmits a command to perform the called function to the measuring instrument 16. then, the diagnostic interface program 48 receives the result of the execution from the measuring instrument 16 and returns the measurement result to the called target diagnostic software module 44.

Here, the diagnostic interface program 48 causes the control device 20 to issue a command corresponding to the kind such as a class of command of the measuring instrument 16 provided in the test apparatus 10 to the measuring instrument 16. For example, even if each measuring instruments 16 performs the same function, the diagnostic interface program 48 issues commands of which descriptions are different from each other to the measuring instruments 16 of which kinds are different from each other. Additionally, the diagnostic interface program 48 accepts the call by the common description from the target diagnostic software modules 44 regardless of the kind of the measuring instrument 16 provided in the test apparatus 10. For example, even if the measuring instrument 16 is replaced with the other kind of the measuring instrument 16, the diagnostic interface program 48 is called from the target diagnostic software modules 44 by the common description provided that the measuring instruments 16 performs the same function.

The diagnostic interface program 48 includes an acquirement module 52, a plurality of software modules 54 and a switching software module 56. Those of software modules are executed by the CPU 2000 of the control device 20. Specifically, the acquirement module 52 is executed by the CPU 2000 to cause the control device to function as a measurement section. The measuring software module 54 is executed by the CPU 2000 to cause the control device 20 to function as a measurement section. The switching software module 56 is executed by the CPU 2000 to cause the control device 20 to function as a switching section.

The acquirement module 52 is executed on the control device 20 and causes the control device 20 to acquire measuring instrument identification information indicative of the kind of the measuring instrument 16 provided in the test apparatus 10. For example, the acquirement module 52 may cause the control device to acquire the measuring instrument identification information of the measuring instrument 16 at configuring the test apparatus 10 or calling from the target diagnostic software module 44. Additionally, for example, the acquirement module 52 may call the bus control software module 46 and cause the control device 20 to read the measuring instrument identification information to identify the kind of the measuring instrument 16 in a register in the measuring instrument 16 provided in the test apparatus 10 which can be accessed from the outside for example. Further, the acquirement module 52 may cause the control device 20 to read the measuring instrument identification information directly stored in the storage device in the control device 20 by the manufacturer of the test apparatus 10.

The acquirement module 52 may cause the control device 20 to further acquire bus identification information indicative of the kind of the buses 22 which connect between the control device 20 and the measuring instruments 16 in addition to the measuring instrument identification information. In this case, the acquirement module 52 may cause the control device 20 to detect whether the measuring instrument 16 is connected to each of the buses 22 connected to the control device 20 and determine that the identification information on the bus detected that the measuring instrument 16 is connected thereto as the bus identification information.

Here, such as the hard disk drive 2040 or the RAM 2020 on the control device 20 may store a configuration file 60 in which the identification information on the test modules 14, the measuring instruments 16 and the buses 22 included in the test apparatus 10 are stored. In this case, the acquirement module 52 may cause the control device 20 to retrieve the configuration file 60 stored in the hard disk drive 2040 on the control device 20 and read the measuring instrument identification information and the bus identification information corresponding to the measuring instrument 16 included in the test apparatus 10. Additionally, the acquirement module 52 may compare the acquired measuring instrument identification information with the information stored in the configuration file 60 to determine whether the kind of the measuring instrument 16 stored in the configuration file 60 is matched with the kind of the measuring instrument 16 indicated by the measuring instrument identification information.

Each measurement software module 54 (54-1, 54-2, . . . ) is provided for each kind of the measuring instruments 16 which can be provided in the test apparatus 10. Each measurement software module 54 is executed on the control device 20 in response to a call from the switching software module 56. Each of the plurality of measurement software modules 54 issues a command which can be accepted by the corresponding kind of the measuring instrument 16 and receives the measurement result from the corresponding kind of the measuring instrument 16.

The measurement software module 54 called from the switching software module 56 causes the control device 20 to issue a command to cause the measuring instrument 16 to measure the value of the reference parameter of the test module 14 designated by the target diagnostic software module 44 to the measuring instrument 16. For example, the measurement software module 54 causes the control device 20 to issue a command to measure the voltage, a command to measure the resistance value and a command to measure the current value to the measuring instrument 16. Additionally, each measurement software module 54 receives the measurement result of the reference parameter from the measuring instrument 16.

In this case, the measurement software module 54 called from the switching software module 56 calls one of the bus control software modules 46 corresponding to the bus identified by the bus identification information and causes the control device 20 to execute the same. Then, the measurement software module 54 causes the control device 20 to issue the command to the measuring instrument 16 through the corresponding bus 22 and receive the measurement result of the reference parameter from the measuring instrument 16.

The switching software module 56 is executed by the control device 20 in response to receiving the call to instruct to measure the vale of the reference parameter included in the test module 14 from the target diagnostic software module 44. The called switching software module 56 calls one of the measurement software modules 54 corresponding to the measuring instrument 16 identified by the measuring instrument identification information and causes the control device to execute the same.

That is, the switching software module 56 identifies the kind of the measuring instrument 16 included in the test apparatus 10 based on the measuring instrument identification information and calls one of the measurement software modules 54 corresponding to the identified kind of measurement software module 54 among the plurality of measurement software modules 54. Then, the switching software module 56 causes the control device 20 to issue to the measuring instrument 16 a command to cause the called measurement software module 54 to measure according to an instruction of the target diagnostic software module 44. Here, in this case, the switching software module 56 may cause the control device to issue a plurality of commands to the measuring instrument 16 in order to cause the measuring instrument 16 to execute one measuring operation according to an instruction of the target diagnostic software module 44. Then, the switching software module 56 returns the measurement result of the reference parameter received by the called measurement software module 54 from the measuring instrument 16 to the target diagnostic software module 44.

As described above, the diagnostic interface program 48 can convert the call by the common description provided from the target diagnostic software module 44 to a command corresponding to the kind of the measuring instrument 16 included in the test apparatus 10 and transmit the same from the control device 20 to the measuring instrument 16. Additionally, the diagnostic interface program 48 can convert the call by the common description provided from the target diagnostic software module 44 to a command corresponding to the kind of the bus 22 to which the measuring instrument 16 is connected and transmit the same from the control device 20 to the measuring instrument 16.

According to the diagnostic program 30 as described above, it is not necessary to change the description of the target diagnostic software module 44 even if the kind of the measuring instrument 16 included in the test apparatus 10 is changed, and the kind of the bus 22 connected to the measuring instrument 16 is also changed. Thereby the diagnostic program 30 can appropriately diagnose regardless of the kind of the measuring instrument 16 which is provided in the test apparatus 10.

Figure 4:
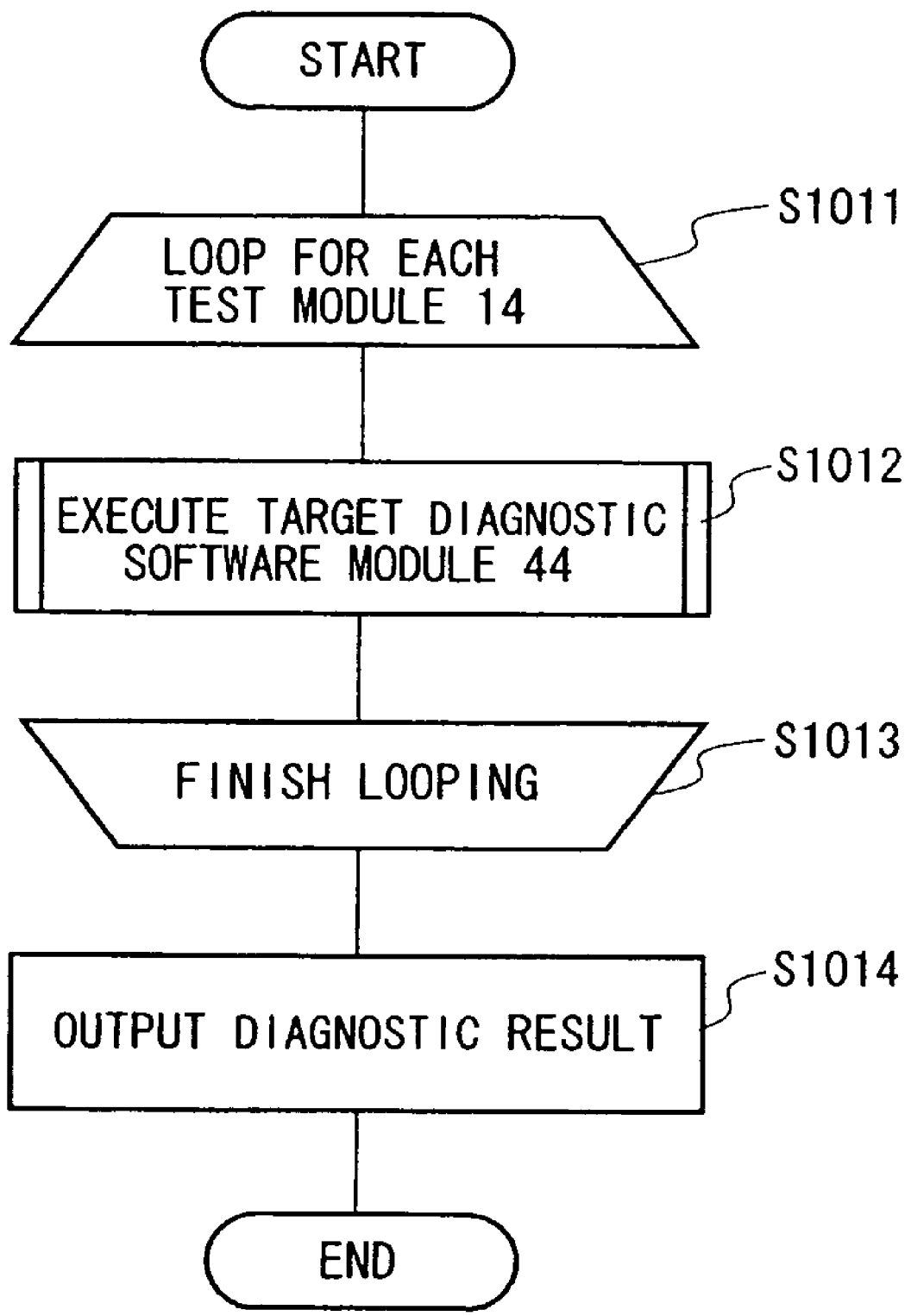
FIG. 4 is a flowchart showing a diagnosis of the test apparatus 10 by the diagnostic program according to an embodiment of the present invention.

FIG. 4 is a flowchart showing a diagnosis of the test apparatus 10 by the diagnostic program 30 according to the present embodiment. Starting to diagnose, the diagnostic control software module 42 executed on the control device 20 executes the target diagnostic software module 44 corresponding to each of the plurality of test modules 14 (S1012). Thereby the diagnostic control software module 42 can cause the control device 20 to sequentially diagnose each of the plurality of test modules 14 (S1011 and S1013).

Finishing diagnosing all of the test modules 14, the diagnostic control software module 42 outputs the diagnostic result acquired from each of the target diagnostic software modules 44 (S1014). A user of the test apparatus 10 can acquire information indicating whether the test apparatus 10 normally operates and information indicating which test module 14 is failed based on the result of diagnosis.

Figure 5:
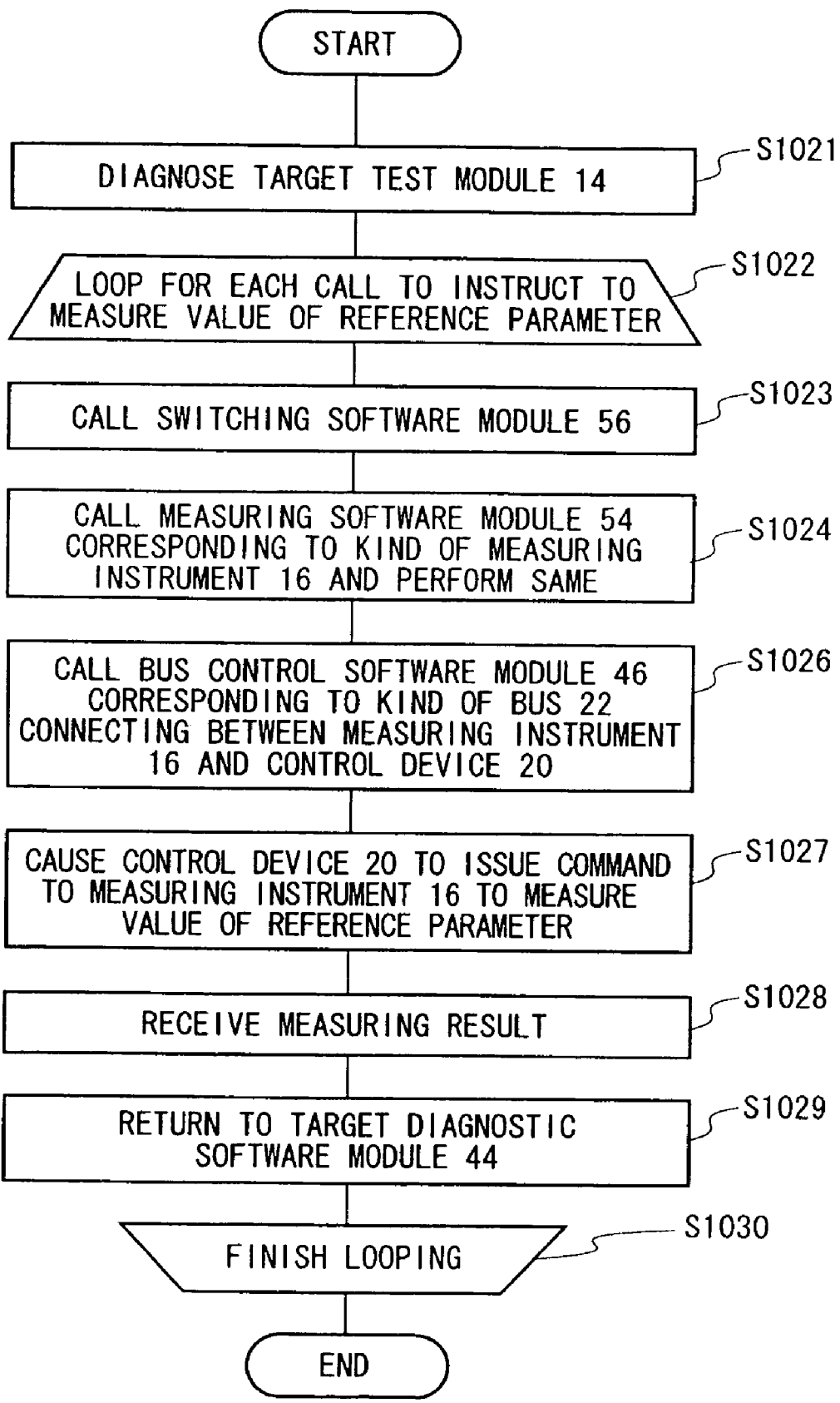
FIG. 5 is a flowchart showing an operation in a step S1012 by the diagnostic program according to an embodiment of the present invention.

FIG. 5 is a flowchart showing an operation in the step S1012 by the diagnostic program according to the present embodiment. The target diagnostic software module 44, the bus control software module 46 and the diagnostic interface program 48 in the diagnostic program 30 are executed on the control device 20 to perform a processing shown in FIG. 5 as the S1012 in FIG. 4.

Firstly, the target diagnostic software module 44 in the diagnostic program 30 diagnoses the target test module 14. Next, the diagnostic program 30 appropriately calls to instruct to measure the value of the reference parameter in diagnosing the test module 14. The diagnostic program 30 performs the processing of S1023-S1029 for each call (S1022 and S1030).

The target diagnostic software module 44 calls the switching software module 56 in the diagnostic interface program 48 (S1023). Next, the switching software module called in the step S1023 calls the measurement software module 54 identified by the measuring instrument identification information and executes the same (S1024). That is, the switching software module 56 calls the measurement software module 54 corresponding to the kind of the measuring instrument 16 provided in the test apparatus 10 and executes the same.

Next, the measurement software module 54 called in the step S1024 calls the bus control software module 46 corresponding to the bus 22 identified by the bus identification information and executes the same (S1026). That is, the measurement software module 54 calls the bus control software module 46 corresponding to the kind of the bus 22 which connects between the test apparatus 10 provided in the test apparatus 10 and the control device 20.

Next, the measurement software module 54 called in the step S1024 causes the control device 20 to issue a command according to the instruction to cause the measuring instrument 16 to measure the designated reference parameter to the measuring instrument 16 through the bus 22 (S1027). Next, the measurement software module 54 called in the step S1024 causes the control device 20 to receive the measurement result of the reference parameter through the bus 22 (S1028). Then, the switching software module 56 returns the measurement result of the reference parameter received by the measurement software module 54 called in the step S1024 to the target diagnostic software module 44 (S1029). Receiving the measurement result, the target diagnostic software module 44 can diagnose the target test module 14.

While the present invention has been described with the embodiment, the technical scope of the invention not limited to the above described embodiment. It is apparent from the scope of the claims that the embodiment added such alternation or improvements can be included in the technical scope of the invention.

What is claimed is:

1. In a test apparatus including test modules that provide test signals to devices under test, a measuring instrument that measures a reference parameter including at least one of a reference voltage, a reference resistance and a reference current of the test module and a control device that controls the test modules and the measuring instrument, a recording medium on which a diagnostic program that causes the control device to diagnose the plurality of test modules by using the measuring instrument is recorded, wherein a kind of the measuring instrument can be changed, the diagnostic program including:

a target diagnostic software module that causes the control device to diagnose a target test module;

an acquirement module that causes the control device to acquire measuring instrument identification information indicative of the kind of the measuring instrument provided in the test apparatus;

a measurement software module provided for each kind of measuring instrument and executed on the control device that causes the control device to issue a command to cause the measuring instrument to measure the value of the reference parameter of the test module to the measuring instrument and receives the measurement result of the reference parameter from the measuring instrument; and a switching software module that calls the measurement software module corresponding to the measuring instrument identified by the measuring instrument identification information, causes the control device to execute the same, and returns the measurement result of the reference parameter to the target diagnostic software module, wherein the diagnostic program is provided for each kind of bus connecting between the control device and the measuring instrument and further includes a bus control software module that causes the control device to communicate between the control device and the measuring instrument through the bus, the acquirement module causes the control device to further acquire bus identification information indicative of the kind of bus connecting between the control device and the measuring instrument, the switching software module calls the measurement software module corresponding to the measuring instrument identified by the measuring instrument identification information in response to receiving a call to instruct to measure the value of the reference parameter of the test module from the target diagnostic software module, and the measurement software module called by the switching software module calls the bus control software module corresponding to the bus identified by the bus identification information, and causes the control device to execute the same and issue the command to the measuring instrument to receive the measurement result of the reference parameter from the measuring instrument.

2. The recording medium as set forth in claim 1, wherein the acquirement module causes the control device to retrieve a configuration file that stores identification information about each test module, each measuring instrument and each bus included in the test apparatus and causes the control device to read the measurement instrument identification information and the bus identification information corresponding to the measuring instrument provided in the test apparatus.

3. The recording medium as set forth in claim 1, wherein the acquirement module causes the control device to detect whether the measuring instrument is connected to each bus connected to the control device and determines whether the identification information about the bus to which the measuring instrument is connected is the bus identification information, and the acquirement module calls the bus control software module and causes the control device to read the measuring instrument identification information to identify the kind of the measuring instrument which is stored in the measuring instrument provided in the test apparatus.

4. In a test apparatus including test modules that provide test signals to devices under test, a measuring instrument that measures a reference parameter including at least one of a reference voltage, a reference resistance and a reference current of the test module and a control device that controls the test modules and the measuring instrument, a recording medium on which a diagnostic interface program called from a target diagnostic software module that causes the control device to diagnose a target test module so as to cause the control device to control the measuring instrument is recorded, wherein a kind of the measuring instrument can be changed, the diagnostic interface program including:

an acquirement module that causes the control device to acquire measuring instrument identification information indicative of the kind of measuring instrument provided in the test apparatus;

a measurement software module provided for each kind of measuring instrument and executed on the control device that causes the control device to issue a command to cause the measuring instrument to measure the value of the reference parameter of the test module to the measuring instrument and receives the measurement result of the reference parameter from the measuring instrument; and a switching software module that calls the measurement software module corresponding to the measuring instrument identified by the measuring instrument identification information in response to receiving a call to instruct to measure the value of a reference parameter included in the test module from the target diagnostic software module, causes the control device to execute the same, and returns the measurement result of the reference parameter to the target diagnostic software module, wherein the diagnostic interface program is provided for each kind of bus connecting between the control device and the measuring instrument and further includes a bus control software module that causes the control device to communicate between the control device and the measuring instrument through the bus, the acquirement module causes the control device to further acquire bus identification information indicative of the kind of bus connecting between the control device and the measuring instrument, and the measurement software module called by the switching software module calls the bus control software module corresponding to the bus identified by the bus identification information, and causes the control device to execute the same and issue the command to the measuring instrument to receive the measurement result of the reference parameter from the measuring instrument.

5. The test apparatus as set forth in claim 4, wherein the measurement processing section called by the switching section causes the control device to issue the command to the measuring instrument to receive the measurement result of the reference parameter from the measuring instrument.

6. A test apparatus that tests a device under test, comprising:
- a test module that provides a test signal to the device under test;
- a measuring instrument that measures a reference parameter including at least one of a reference voltage, a reference resistance and a reference current included in the test module wherein a kind of the measuring instrument can be changed; and
- a control device that controls the test module and the measuring instrument,
  - wherein by executing a diagnostic program that diagnoses a plurality of test modules by using measuring instruments, the control device functions as:
- a target diagnostic section that diagnoses a target test module;
- an acquirement section that acquires measuring instrument identification information indicative of the kind of measuring instrument provided in the test apparatus;
- a measurement processing section provided for each kind of measuring instrument and executed on the control device that issues a command to cause the measuring instrument to measure the value of the reference parameter of the test module to the measuring instrument and receives a measurement result of the reference parameter from the measuring instrument; and
- a switching section that calls the measurement processing section corresponding to the measuring instrument identified by the measuring instrument identification information in response to receiving a call to instruct to measure the value of a reference parameter included in the test module from the target diagnostic section, executes the same, and returns the measurement result of the reference parameter to the target diagnostic section,
  - wherein the diagnostic program is provided for each kind of bus connecting between the control device and the measuring instrument and further includes a bus control software module that causes the control device to communicate between the control device and the measuring instrument through the bus,
- the acquirement section causes the control device to further acquire bus identification information indicative of the kind of bus connecting between the control device and the measuring instrument, and
- the measurement processing section called by the switching section calls the bus control software module corresponding to the bus identified by the bus identification information, and causes the control device to execute the same.

7. In a test apparatus including test modules that provide test signals to devices under test, a measuring instrument that measure a reference parameter including at least one of a reference voltage, a reference resistance and a reference current of the test module and a control device that controls the test module and the measuring instrument, a diagnostic method of causing the control device to diagnose the plurality of test modules by using the measuring instrument, wherein a kind of measuring instrument can be changed, the diagnostic method comprising:
- causing a target diagnostic software module that diagnoses a target test module to execute on the control device;
- causing the control device to acquire measuring instrument identification information indicative of the kind of measuring instrument provided in the test apparatus;
- causing a measurement software module provided for each kind of measuring instrument and executed on the control device that causes the control device to issue a command to cause the measuring instrument to measure the value of a parameter of the test module and receives the measurement result of the reference parameter from the measuring instrument to execute on the control device; and
- calling the measurement software module corresponding to the measuring instrument identified by the measuring instrument identification information in response to receiving a call to instruct to measure the value of the reference parameter included in the test module from the target diagnostic software module, causing the control device to execute the same, and returning the measurement result of the reference parameter to the target diagnostic software module,
- wherein a diagnostic program is provided for each kind of bus connecting between the control device and the measuring instrument and includes a bus control software module that causes the control device to communicate between the control device and the measuring instrument through the bus,
- an acquirement module causes the control device to further acquire bus identification information indicative of the kind of bus connecting between the control device and the measuring instrument, and
- the measurement software module called by the switching software module calls the bus control software module corresponding to the bus identified by the bus identification information, and causes the control device to execute the same and issue the command to the measuring instrument to receive the measurement result of the reference parameter from the measuring instrument.

* * * * *